United States Patent
Ishikawa et al.

[11] Patent Number: 6,097,612
[45] Date of Patent: Aug. 1, 2000

[54] RADIO FREQUENCY MODULE AND METHOD FOR FABRICATING THE RADIO FREQUENCY MODULE

[75] Inventors: Osamu Ishikawa, Kyoto; Masahiro Maeda, Osaka, both of Japan

[73] Assignee: Matsushita Electric Industrial Co., Ltd., Kadoma, Japan

[21] Appl. No.: 08/872,950

[22] Filed: Jun. 11, 1997

[30] Foreign Application Priority Data

Jun. 13, 1996 [JP] Japan .................................. 8-152060

[51] Int. Cl.⁷ ...................................... H05K 7/02
[52] U.S. Cl. .................. 361/794; 361/728; 361/736; 361/746; 361/760; 361/762; 361/767; 361/783; 361/807; 257/676; 257/684; 257/690; 257/698; 257/704; 257/787; 257/773; 257/774; 174/52.4; 174/52.1
[58] Field of Search .................................. 361/794, 728, 361/736, 746, 748, 752, 760, 762, 767, 777, 783, 807, 809, 820; 257/676, 684, 690, 693, 698, 750, 701, 704, 786, 787, 773, 774; 174/52.4, 52.1

[56] References Cited

U.S. PATENT DOCUMENTS

| | | | |
|---|---|---|---|
| 5,241,133 | 8/1993 | Mullen, III et al. | 174/52.4 |
| 5,243,320 | 9/1993 | Clouser et al. | 338/308 |
| 5,500,555 | 3/1996 | Ley | 257/700 |
| 5,541,450 | 7/1996 | Jones et al. | 257/697 |
| 5,569,955 | 10/1996 | Chillara et al. | 257/666 |
| 5,599,747 | 2/1997 | Bhatt et al. | 29/832 |

FOREIGN PATENT DOCUMENTS

| | | |
|---|---|---|
| 506122 A2 | 9/1992 | European Pat. Off. . |
| 2244264 | 11/1975 | France . |
| 3936322 | 10/1990 | Germany . |
| 49067553 | 11/1980 | Japan . |
| 61-193462 | 8/1986 | Japan . |
| 3272189 | 12/1991 | Japan . |

*Primary Examiner*—Leo P. Picard
*Assistant Examiner*—David Foster
*Attorney, Agent, or Firm*—Renner, Otto, Boisselle & Sklar, P.L.L.

[57] ABSTRACT

The radio frequency module of the present invention includes an insulating substrate having a first metal film on a first principal surface thereof and a second metal film on a second principal surface thereof opposed to the first principal surface and a semiconductor device. The semiconductor device is thermally and electrically coupled to the second metal film, and a thickness of the second metal film is larger than that of the first metal film.

20 Claims, 15 Drawing Sheets

RADIO FREQUENCY MODULE AND METHOD FOR FABRICATING THE RADIO FREQUENCY MODULE

BACKGROUND OF THE INVENTION

1. Field of the Invention

The present invention relates to a radio frequency module operating at a frequency of several hundred MHz or higher and a method for fabricating the same. More particularly, the present invention relates to a radio frequency module including active elements (such as transmission power transistors) mounted on a printed circuit board and a method for fabricating the same.

2. Description of the Related Art

A typical "radio frequency module" implements a compact radio frequency circuit by mounting principally various chip components at a high density on a printed circuit board of a small size. Specifically, a radio frequency module includes various active elements such as transmission power transistors and various kinds of small-sized passive elements or chip components such as resistors, capacitors and inductors. Both the active elements and the passive elements are mounted on a printed circuit board on which transmission lines such as microstrip lines have been formed. A radio frequency module operates at a frequency of several hundred MHz or higher and is typically used as a transmission section for various kinds of mobile communication units such as transceivers, cellular phone units and the like.

A radio frequency module used as a transmission section generally implements a two-stage or three-stage radio frequency power amplifier circuit including a plurality of field effect transistors (hereinafter, simply referred to as "FETs"). The impedance of a radio frequency module viewed from an external circuit at the terminal thereof for inputting/outputting a radio frequency signal therethrough is adjusted to be 50 Ω and a direct current bias circuit is incorporated therein.

A prior art metal base substrate for a radio frequency module is described, for example, in Japanese Laid-Open Patent Publication No. 3-272189. The metal base substrate described in this patent publication includes an insulating film, and a metal plate and a sheet of conductive metal foil which are adhered to both surfaces of the insulating film.

Also, a prior art radio frequency module is described, for example, in Japanese Laid-Open Patent Publication No. 5-95236. FIG. 13 is a schematic cross-sectional view of the radio frequency module described in this patent publication. The radio frequency module shown in FIG. 13 includes a circuit board 1310 and a semiconductor device 1320 which have been mounted on a radiator plate 1300 by means of soldering. The circuit board 1310 has a multi-layer structure of a metal film 1312, a resin substrate 1314 and another metal film 1316. A solder layer 1330 connects the circuit board 1310 and the semiconductor device 1320 to the radiator plate 1300, respectively.

The semiconductor device 1320 includes: an FET chip 1322; a package metal base 1323; a ceramic frame 1324; electrodes 1325; a source wire 1326; a gate wire 1327; a drain wire 1328; and lead terminals 1329.

The heat generated from the FET chip 1322 is passed through the package metal base 1323 and the solder layer 1330 to be transmitted into the radiator plate 1300.

In order to fabricate the radio frequency module shown in FIG. 13, the circuit board 1310 and the semiconductor device 1320 must be individually soldered to the radiator plate 1300. Thus, the radio frequency module shown in FIG. 13 has a problem in that the number of required process steps is increased. Also, the lead terminals 1329 must be connected to the circuit board 1310 of an individual module.

Furthermore, the radio frequency module shown in FIG. 13 cannot be tested until the radiator plate 1300 has been mounted. This is because the characteristics of the FET chip 1322 in an operation state are required to be tested under the same conditions as the conditions where the radio frequency module is actually used or the state where the radiator plate 1300 has already been mounted. However, in order to mount the radiator plate 1300 onto the radio frequency module, the circuit board 1310 having a small area corresponding to an individual radio frequency module must be cut out from a circuit board having a larger area corresponding to a plurality of radio frequency modules. Consequently, a prior art radio frequency module cannot be tested before the circuit board 1310 for an individual radio frequency module is cut out from the larger sized circuit board. Thus, the radio frequency module can be tested only after the individual radio frequency module is completed. Therefore, in accordance with the conventional technologies, multiple radio frequency modules on an identical large-sized circuit board 1310 cannot be tested simultaneously.

As described above, since the conventional radio frequency module cannot reduce the number of necessary components and the number of necessary process steps, the reduction in size and cost of a single module and the automatic fabrication of the modules cannot be realized.

SUMMARY OF THE INVENTION

The radio frequency module of the present invention includes an insulating substrate having a first metal film on a first principal surface thereof and a second metal film on a second principal surface thereof opposed to the first principal surface and a semiconductor device. In the radio frequency module, the semiconductor device is thermally and electrically coupled to the second metal film, and a thickness of the second metal film is larger than that of the first metal film.

In one embodiment, the radio frequency module further includes an opening extending through the first metal film and the insulating substrate, and the semiconductor device is thermally and electrically coupled to the second metal film located inside the opening.

In another embodiment, the radio frequency module further includes a via hole for thermally and electrically coupling the first metal film to the second metal film, and the semiconductor device is thermally and electrically coupled to the second metal film through the via hole.

In still another embodiment, the thickness of the first metal film is from about 10 $\mu$m to about 100 $\mu$m, both inclusive, and the thickness of the second metal film is from about 100 $\mu$m to about 1000 $\mu$m, both inclusive.

In still another embodiment, the thickness of the first metal film is from about 30 $\mu$m to about 50 $\mu$m, both inclusive, and the thickness of the second metal film is from about 200 $\mu$m to about 300 $\mu$m, both inclusive.

In still another embodiment, the first metal film or the second metal film includes a multi-layer structure of copper/nickel/gold layers or a multi-layer structure of copper/titanium/gold layers. The copper/nickel/gold layers and the copper/titanium/gold layers are stacked such that distances from a center in a thickness direction of the second metal film to the copper/nickel/gold layers and the copper/titanium/gold layers increase in this order.

In still another embodiment, the semiconductor device is sealed inside a package.

In still another embodiment, the semiconductor device is a bare chip.

In still another embodiment, the semiconductor device is mounted on a metal block.

In still another embodiment, the semiconductor device is coupled to the second metal film thermally at a heat resistance of about 3° C./W or less and electrically at an electrical resistance of about 1 Ω or less.

In still another embodiment, the second metal film is patterned.

In still another embodiment, at least a part of the patterned second metal film is electrically coupled to the first metal film through a via hole.

According to another aspect of the present invention, a method for fabricating a radio frequency module is provided. The method includes the steps of providing an opening through an insulating substrate and a first metal film, the insulating substrate having the first metal film formed on a first principal surface thereof and a second metal film formed on a second principal surface thereof opposed to the first principal surface, a thickness of the second metal film being larger than that of the first metal film, and coupling thermally and electrically a semiconductor device to the second metal film located inside the opening.

In one embodiment, the method includes the steps of: thermally and electrically coupling the semiconductor device to the second metal film located inside the opening in an undivided substrate in which a plurality of said insulating substrates are combined; performing a test or an adjustment of characteristics of each of a plurality of radio frequency modules formed on the plurality of insulating substrates while the undivided substrate is still undivided and after the step of coupling; and dividing the undivided substrate into the plurality of insulating substrates after the step of performing the test or the adjustment.

In another embodiment, the method includes the steps of: thermally and electrically coupling the semiconductor device to the second metal film located inside the opening in an undivided substrate in which a plurality of said insulating substrates are combined; mounting shield members onto the plurality of insulating substrates while the undivided substrate is still undivided and after the step of coupling; and dividing the undivided substrate into the plurality of insulating substrates after the step of mounting the shield members.

In still another embodiment, the step of thermally and electrically coupling the semiconductor device to the second metal film located inside the opening includes a step of mounting the semiconductor device onto the second metal film via solder.

In still another embodiment, the step of providing the opening includes the steps of: opening a hole through the first metal film and the insulating substrate; selectively applying an adhesive onto any of the first metal film, the insulating substrate and the second metal film in accordance with a distance from an edge portion of the opening hole; and attaching the first metal film, the insulating substrate and the second metal film to each other.

In still another embodiment, the step of providing the opening includes the steps of: attaching the first metal film, the insulating substrate and the second metal film to each other; and opening a hole through the first metal film and the insulating substrate after the step of attaching.

According to still another aspect of the present invention, a method for fabricating a radio frequency module is provided. The method includes the steps of providing a via hole through an insulating substrate having a first metal film formed on a first principal surface thereof and a second metal film formed on a second principal surface thereof opposed to the first principal surface, a thickness of the second metal film being larger than that of the first metal film, the via hole coupling thermally and electrically the first metal film to the second metal film, and thermally and electrically coupling a semiconductor device to the first metal film.

In one embodiment, the method includes the steps of: thermally and electrically coupling the semiconductor device to the first metal film in an undivided substrate in which a plurality of said insulating substrates are combined; performing a test or an adjustment of characteristics of each of a plurality of radio frequency modules formed on the plurality of insulating substrates while the undivided substrate is still undivided and after the step of coupling; and dividing the undivided substrate into the plurality of insulating substrates after the step of performing the test or the adjustment.

In another embodiment, the method includes the steps of: thermally and electrically coupling the semiconductor device to the first metal film in an undivided substrate in which a plurality of said insulating substrates are combined; mounting shield members onto the plurality of insulating substrates while the undivided substrate is still undivided and after the step of coupling; and dividing the undivided substrate into the plurality of insulating substrates after the step of mounting the shield members.

In still another embodiment, the step of thermally and electrically coupling the semiconductor device to the first metal film includes a step of mounting the semiconductor device onto the first metal film via solder.

Thus, the invention described herein makes possible the advantage of providing a radio frequency module and a method for fabricating the same which can reduce the number of required components and the number of required process steps for fabricating a smaller size individual module and is suitable for an automated operation test using machinery.

This and other advantages of the present invention will become apparent to those skilled in the art upon reading and understanding the following detailed description with reference to the accompanying figures.

FIB. 3A is an enlarged plan view of the radio frequency module of the present invention as seen from above the principal surface thereof.

Figure 3A:
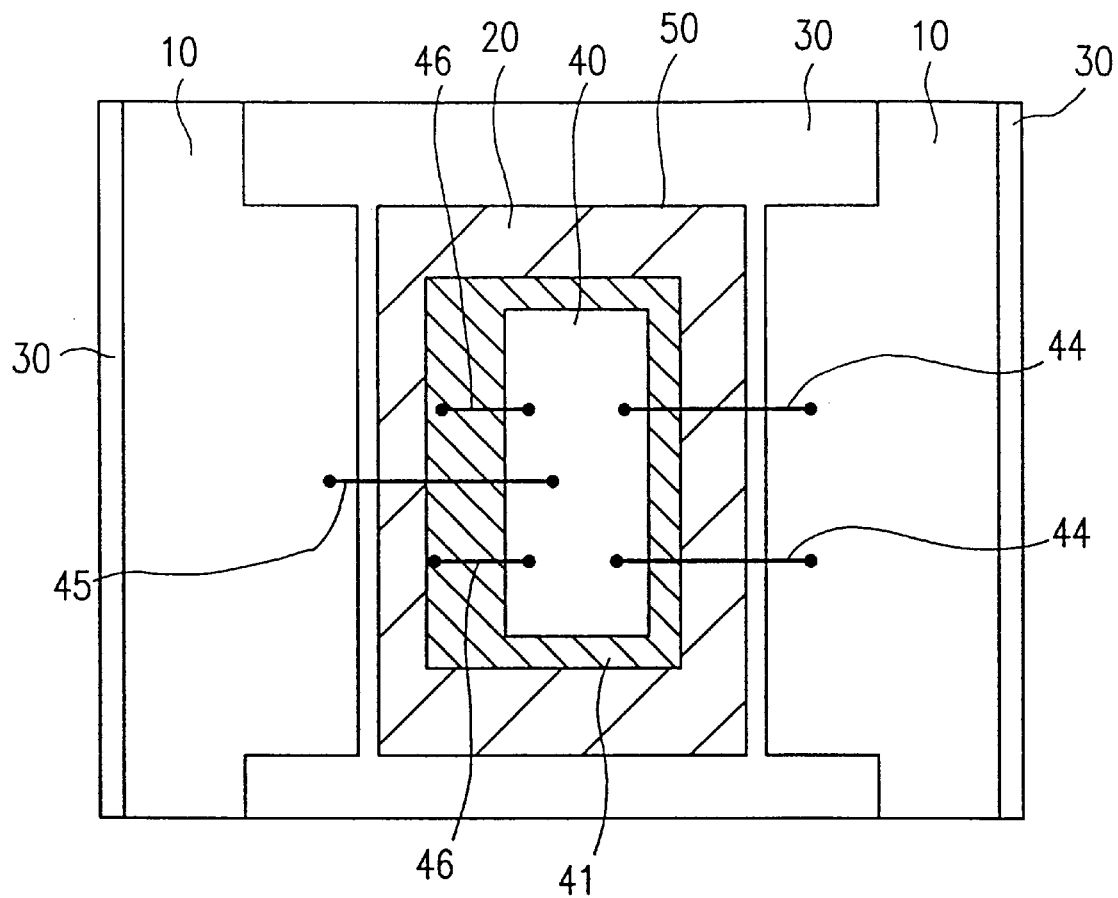
Figure 3B:
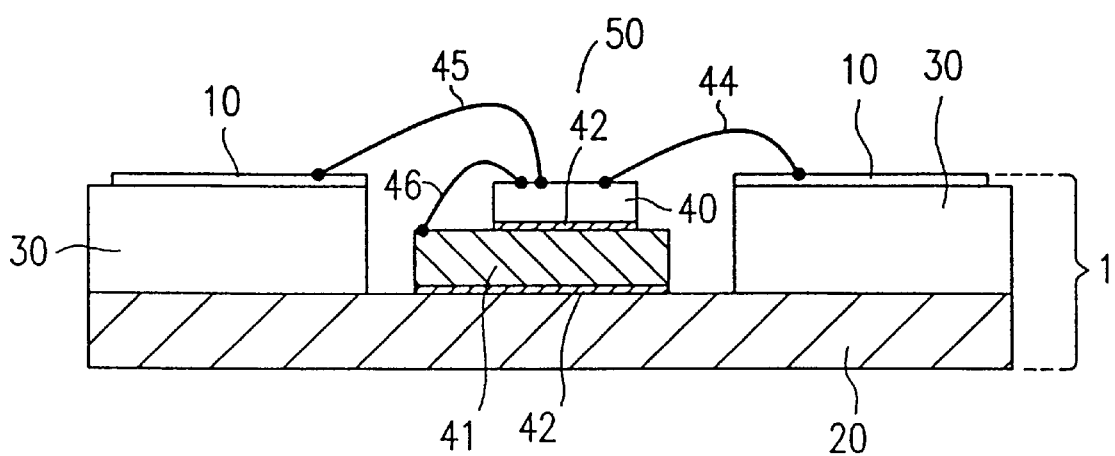

FIG. 3B is an enlarged cross-sectional view of the radio frequency module of the present invention.

Figure 1A:
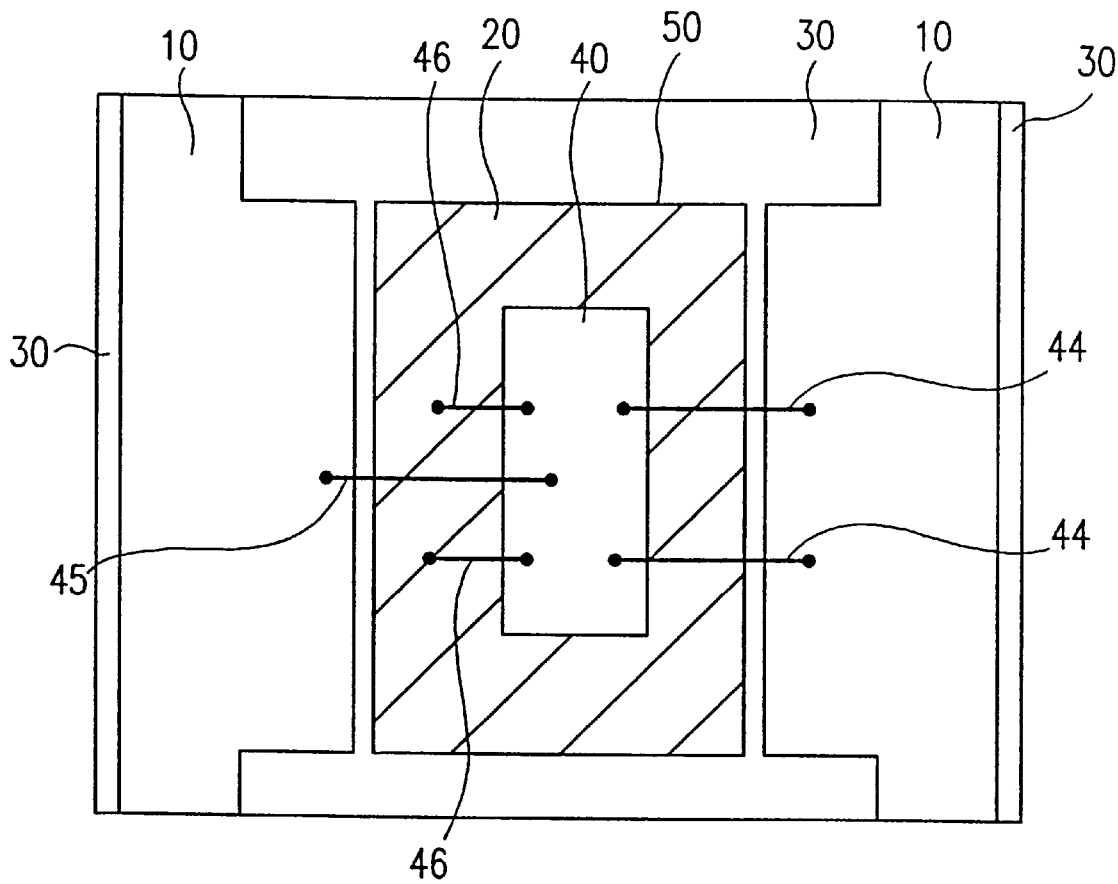
FIG. 1A is an enlarged plan view of the radio frequency module of the present invention as seen from above the principal surface thereof.
Figure 1B:
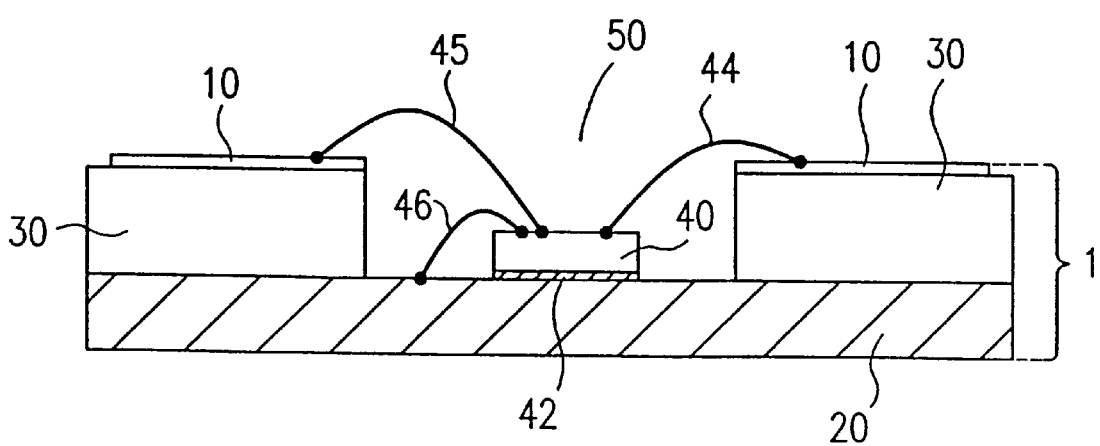
FIG. 1B is an enlarged cross-sectional view of the radio frequency module of the present invention.

FIGS. 4A through 4D are views showing an exemplary set of steps of a method for fabricating the printed circuit board 1 shown in FIGS. 1A and 1B.

Figure 5A:
Figure 5B:
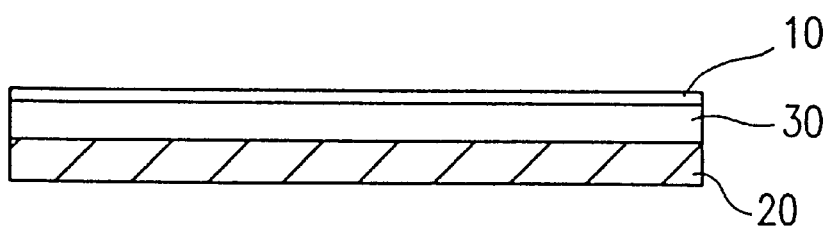
Figure 5C:
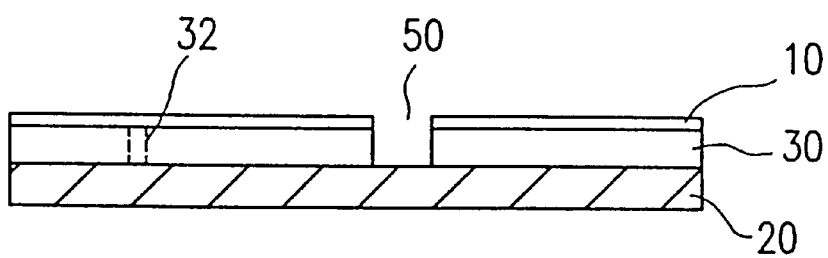

FIGS. 5A through 5C are views showing another exemplary set of steps of a method for fabricating the printed circuit board 1 shown in FIGS. 1A and 1B.

Figure 6A:
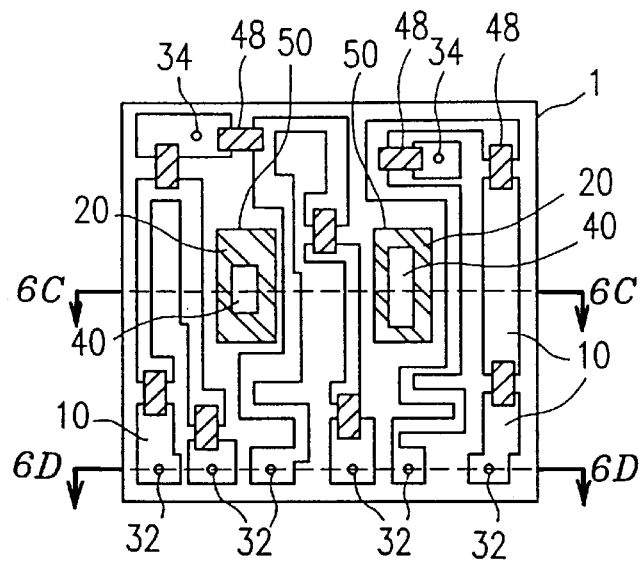

FIG. 6A is a plan view of the radio frequency module of the present invention as seen from above the principal surface thereof.

Figure 6B:
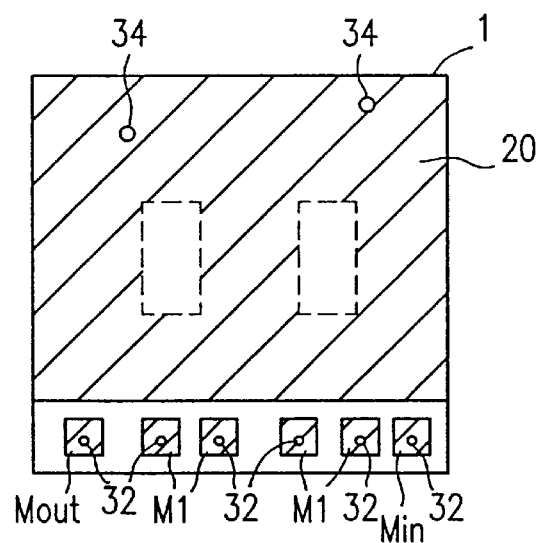

FIG. 6B is a plan view of the radio frequency module of the present invention as seen from above the back surface thereof.

Figure 6C:
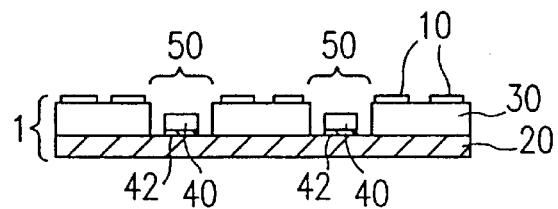

FIG. 6C is a cross-sectional view taken along the line VIC—VIC shown in FIG. 6A.

Figure 6D:
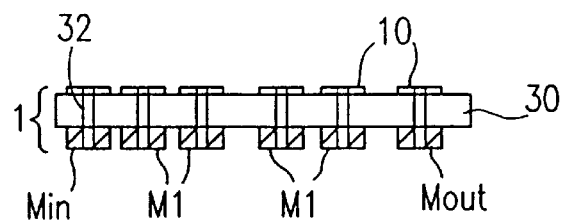

FIG. 6D is a cross-sectional view taken along the line VID—VID shown in FIG 6A.

Figure 7A:
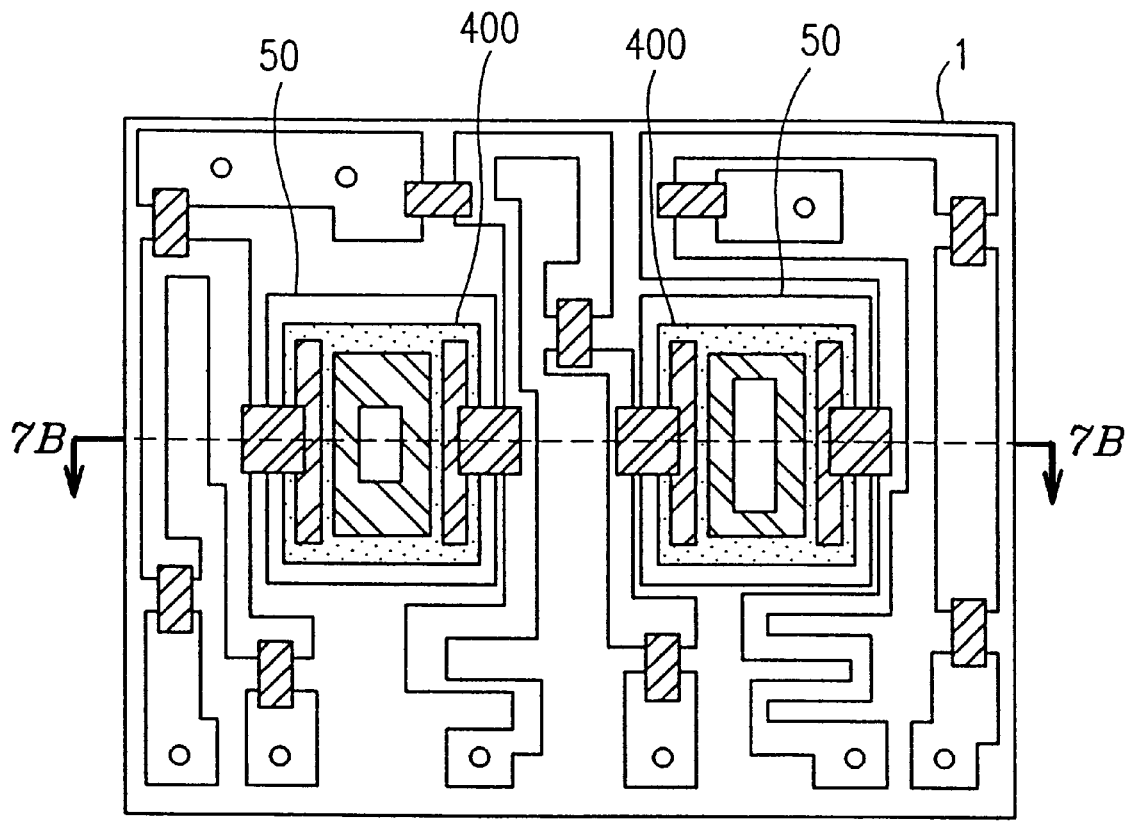

FIG. 7A is a plan view of the radio frequency module of the present invention as seen from above the principal surface thereof.

Figure 7B:
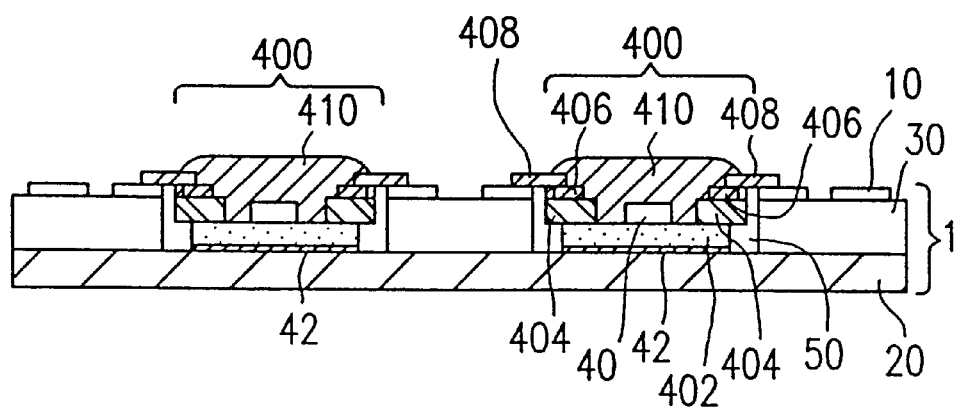

FIG. 7B is a cross-sectional view taken along the line VIIB—VIIB shown in FIG 7A.

Figure 8A:
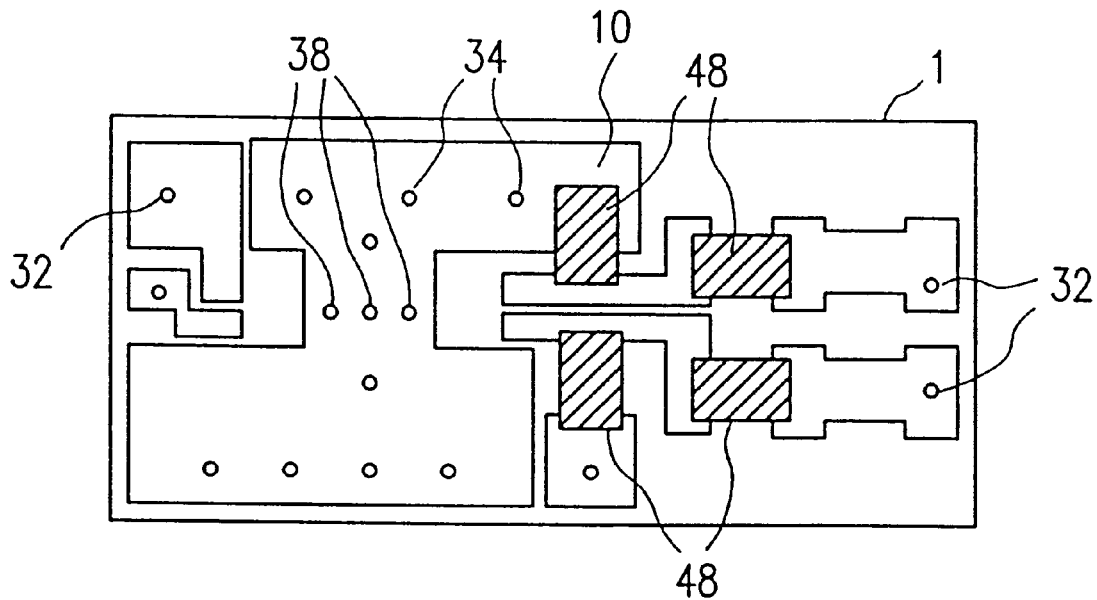

FIG. 8A is a plan view of the radio frequency module of the present invention (on which a semiconductor device has not been mounted yet) as seen from above the principal surface thereof.

Figure 8B:
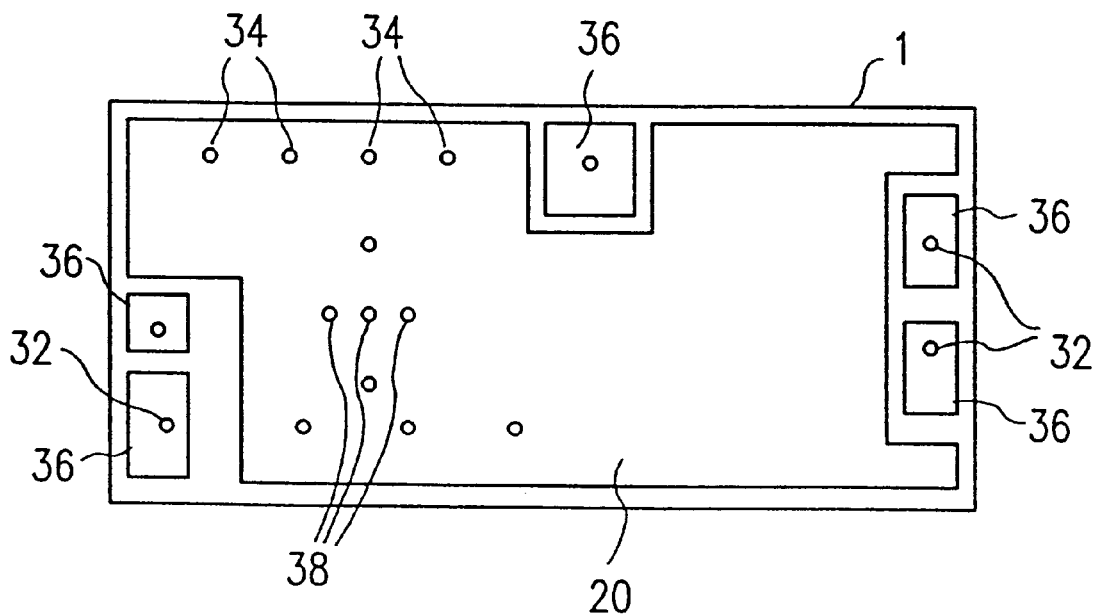

FIG. 8B is a plan view of the radio frequency module of the present invention as seen from above the back surface thereof.

Figure 8C:
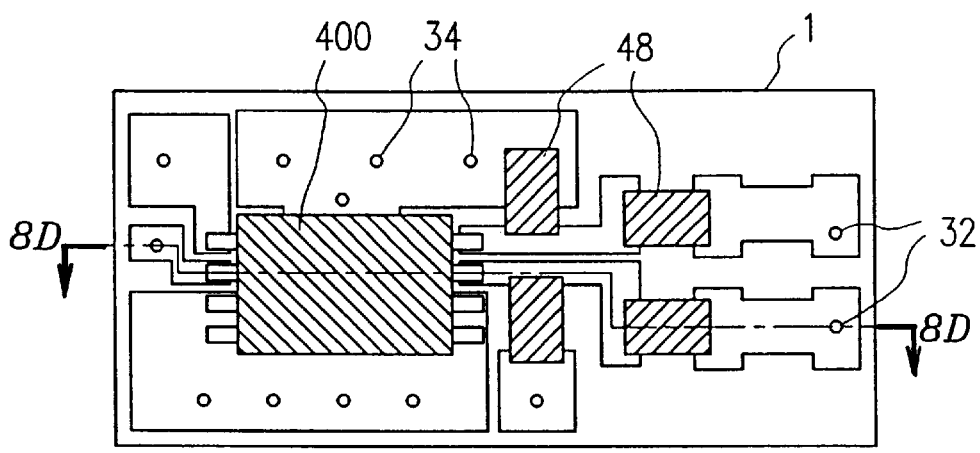

FIG. 8C is a plan view of the radio frequency module of the present invention (on which the semiconductor device has already been mounted) as seen from above the principal surface thereof.

Figure 8D:
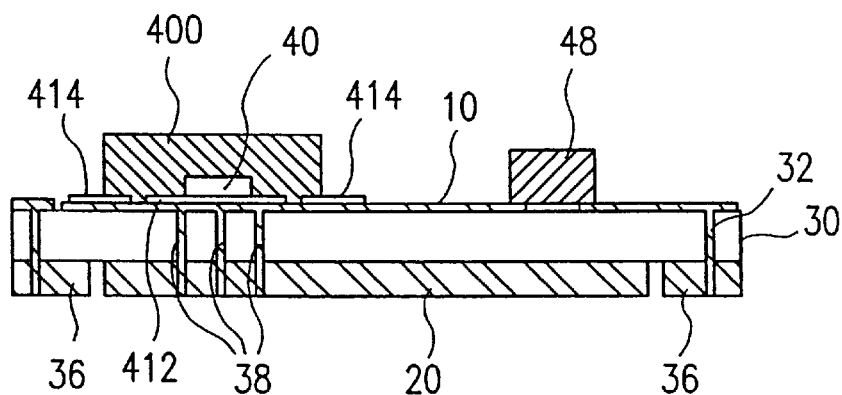

FIG. 8D is a cross-sectional view taken along the line VIIID—VIIID shown in FIG. 8C.

Figure 9A:
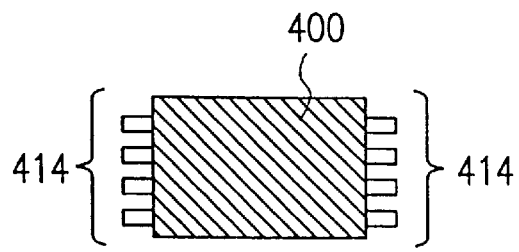

FIG. 9A is a plan view of the semiconductor device 400 to be mounted onto the printed circuit board 1 shown in FIGS. 8A and 8B as seen from above a side opposite to a side including a ground electrode on the back surface of a package.

Figure 9B:
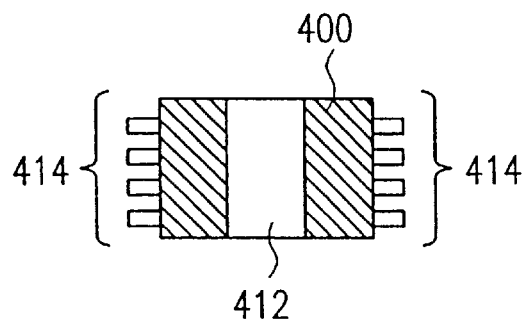

FIG. 9B is a plan view of the semiconductor device 400 to be mounted onto the printed circuit board 1 shown in FIGS. 8A and 8B as seen from above the side including the ground electrode on the back surface of the package.

FIGS. 10A through 10F are views showing the process steps of a method for fabricating the radio frequency module of the present invention.

Figure 11:
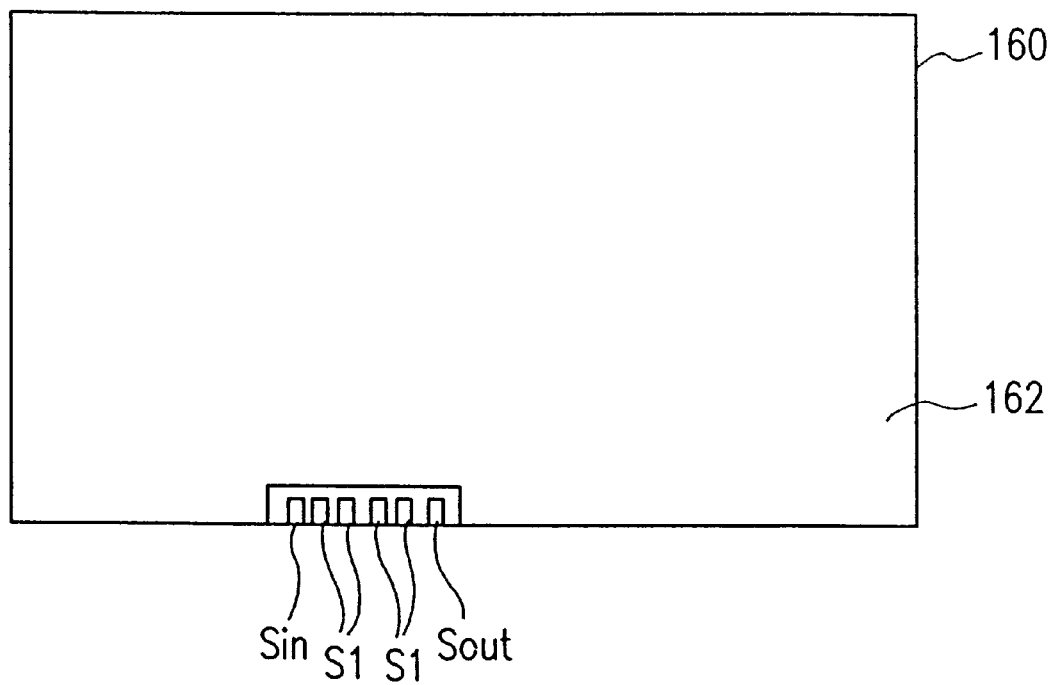

FIG. 11 is a plan view of a tester substrate 160 as seen from above a surface on which an undivided circuit board 100 is placed.

Figure 12A:
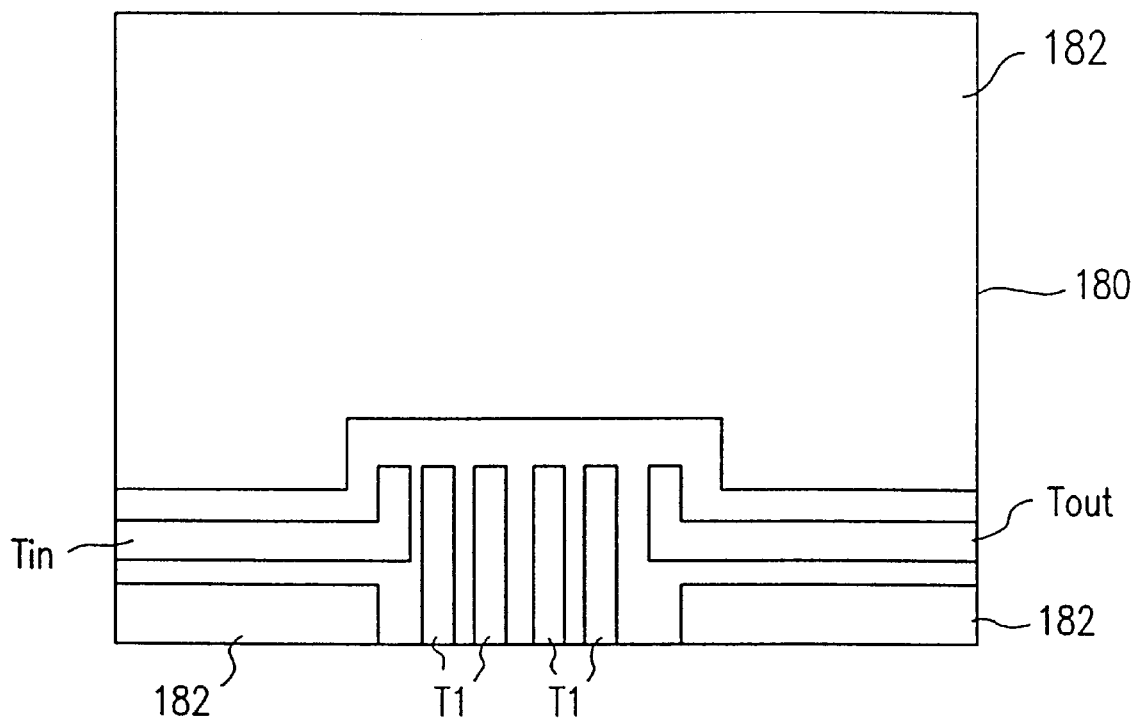

FIG. 12A is a view showing another exemplary substrate used for testing the radio frequency module.

Figure 12B:
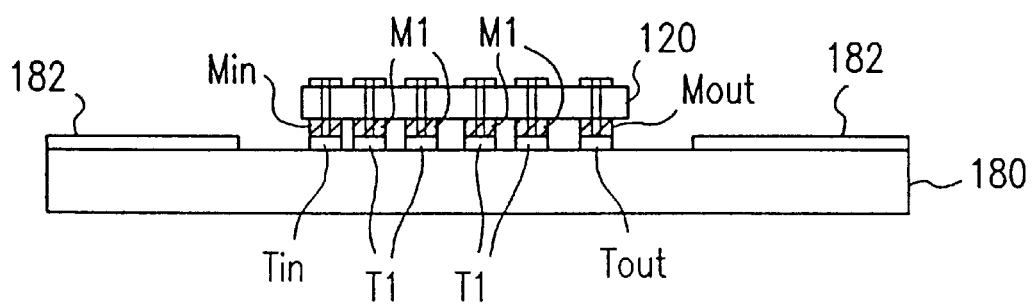

FIG. 12B is a cross-sectional view illustrating the testing of the radio frequency module.

Figure 13:
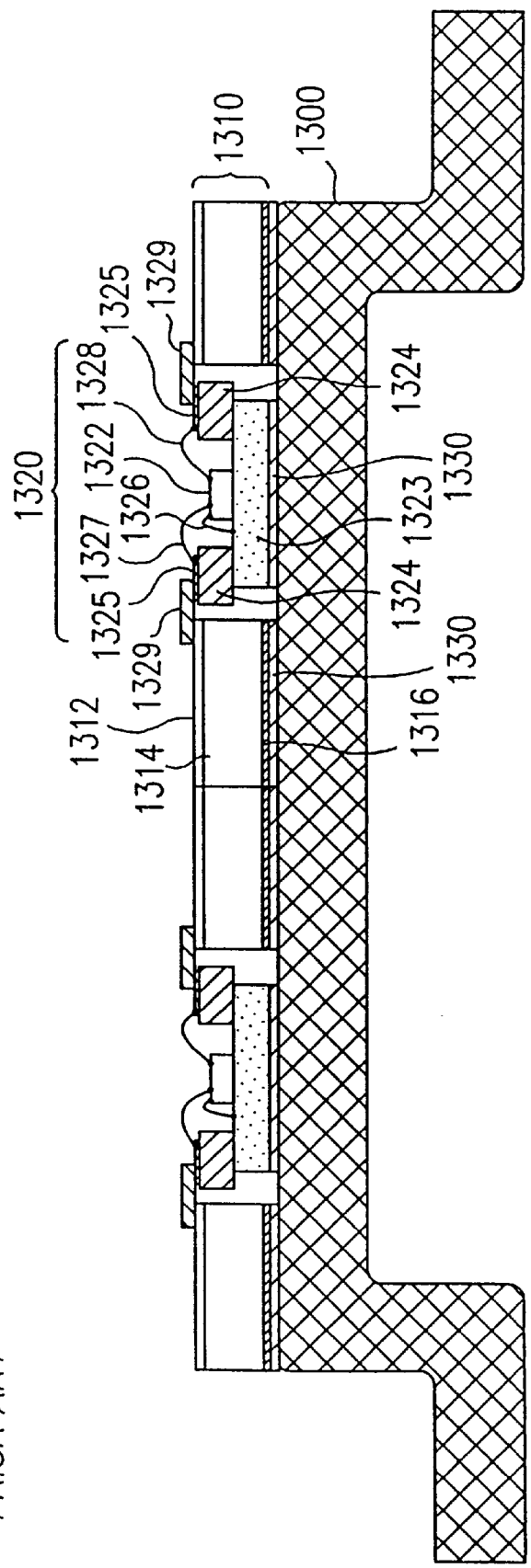

FIG. 13 is a schematic cross-sectional view showing a conventional radio frequency module.

DESCRIPTION OF THE PREFERRED EMBODIMENTS

Hereinafter, the embodiments of the present invention will be described with reference to the accompanying drawings, in which the same reference numerals denote the same components.

The radio frequency module of the present invention is typically used at a frequency of several hundred MHz or higher and preferably within the 800 MHz band.

The radio frequency module to be described below implements a two-stage radio frequency amplifier circuit using two FETs. However, the circuit and the circuit configuration to which the present invention is applicable are not limited thereto. It should however be noted that the radio frequency module of the present invention can attain more remarkable effects when the radio frequency module is implemented as a circuit including a heat generating element.

OUTLINE OF THE INVENTION

Hereinafter, the principles of the present invention will be briefly described. The radio frequency module of the present invention includes a printed circuit board and various elements mounted thereon. A circuit pattern for connecting respective components is provided for the printed circuit board. The printed circuit board has a "principal-surface metal film" on which the respective components are mounted and a "back-surface metal film", almost all the area of which is occupied by a ground pattern, to which a ground potential is applied. The principal-surface metal film and the back-surface metal film are typically metal films mainly made of copper (i.e., so-called "copper foil") and are attached onto both surfaces of an insulating substrate. According to the present invention, the thickness of the back-surface metal film is larger than that of the principal-surface metal film. Some of the components which are mounted on the pattern surface and generate heat are thermally and electrically coupled to the back-surface metal film having a larger thickness. As a result, the back-surface metal film of the printed circuit board absorbs the heat generated from the components.

The thermal and electrical coupling between the heat generating components and the back-surface metal film is realized, for example, in any of the following manners:

(i) An opening is provided so as to extend through the principal-surface metal film and the insulating substrate and various components are mounted (e.g., soldered) onto the upper surface of the back-surface metal film which has been exposed inside the opening. The heat generating components are thermally and electrically coupled to the back-surface metal film via the solder layer.

(ii) Various components are mounted (e.g., soldered) onto the upper surface of the principal-surface metal film and the principal-surface metal film on which the components have been mounted is connected to the back-surface metal film through via holes or the like. The heat generating components are thermally and electrically coupled to the back-surface metal film by the solder layer, the principal-surface metal film and the via holes.

In both the cases (i) and (ii), it is no longer necessary to provide a radiator plate for a radio frequency module. Effects like downsizing a module and reducing the number of required process steps can be attained.

EXAMPLE 1

FIG. 1A is an enlarged plan view of the radio frequency module of the present invention as seen from above the principal surface thereof. FIG. 1B is an enlarged cross-sectional view of the radio frequency module of the present invention.

The radio frequency module of the present invention includes a printed circuit board 1. The printed circuit board 1 includes: an insulating substrate 30; a metal film 10 formed on the principal surface of the insulating substrate 30; and a metal film 20 formed on the back surface facing the principal surface. The thickness of the metal film 20 is larger than that of the metal film 10. The metal films 10 and 20 are typically made of copper but may be made of any other metal material so long as the metal material has a sufficiently low electrical resistance. The insulating substrate 30 is typically made of a glass epoxy resin. However, the material usable for the insulating substrate 30 is not limited thereto but includes teflon and other resins such as a paper-based epoxy resin.

The printed board 1 has an opening 50 provided through the metal film 10 and the insulating substrate 30. As shown in FIG. 1A, a part of the upper surface of the metal film 20 is exposed inside the opening 50 and a semiconductor chip 40 is mounted on the exposed part of the surface of the metal film 20.

The semiconductor chip 40 is mounted in a bare chip manner, i.e., in a state where the semiconductor chip 40 has not been sealed inside a package yet. The bare chip mounting technique can reduce the thickness of the radio frequency module. The semiconductor chip 40 is die bonded onto the surface of the metal film 20 inside the opening 50 by means of soldering. Thus, the semiconductor chip 40 is thermally and electrically coupled to the metal film 20 by a solder layer 42. As a result, a ground potential or the like can be applied to a predetermined terminal of the semiconductor chip 40 and the heat generated by the semiconductor chip 40 can be dissipated into the metal film 20. Preferably, the semiconductor chip 40 is coupled to the metal film 20 thermally at a heat resistance of about 3° C./W or less, and electrically at an electrical resistance of about 1 Ω or less.

Since the frequency selected for operating the radio frequency module is several hundred MHz or higher, the thickness of the metal film 10 is preferably about 10 μm or more in order to prevent the inductance from being increased owing to the skin effects, and preferably less than about 100 μm in order to form a fine pattern suitable for a radio frequency circuit thereon. More preferably, the thickness of the metal film 10 is in an approximate range from about 30 μm to about 50 μm, both inclusive.

In order to attain sufficient radiation effects, the thickness of the metal film 20 is preferably about 100 μm or more. On the other hand, in order to form a pattern for providing external connection terminals on the metal film 20, the thickness of the metal film 20 is preferably 1000 μm or less. More preferably, the thickness of the metal film 20 is in an approximate range from about 200 μm to about 300 μm, both inclusive.

The drain, gate and source of the semiconductor chip 40 are wire bonded to a predetermined circuit pattern and the like via drain wires 44, a gate wire 45 and source wires 46. The wire bonding is performed by a generally used wire bonder.

The radio frequency module of the present invention shown in FIGS. 1A and 1B includes the metal film 20, having a thickness large enough to dissipate the heat generated from the semiconductor chip 40, on the back surface of the printed circuit board 1. As a result, since a radiator plate is no longer necessary, the number of required components and the size can be reduced.

It is noted that resin may be filled into the opening 50 so as to cover the semiconductor chip 40 in a bare chip state therewith.

Figure 2A:
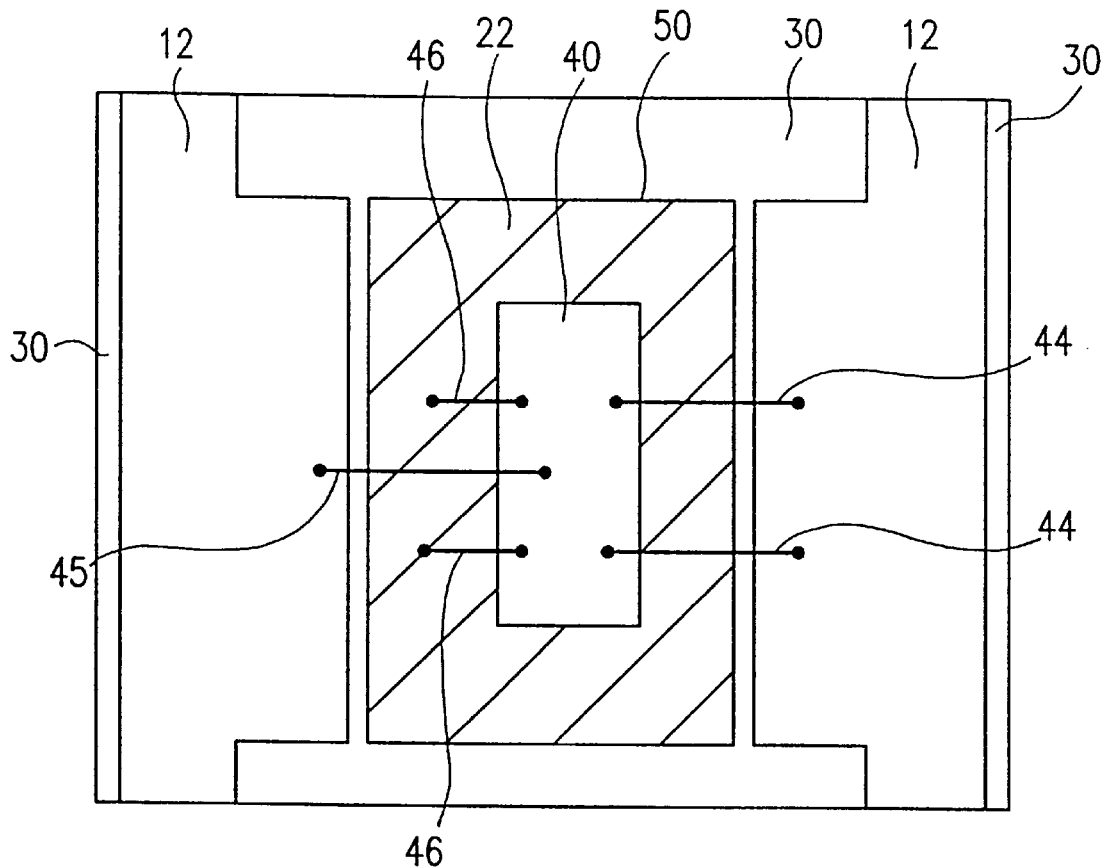
FIG. 2A is an enlarged plan view of the radio frequency module of the present invention as seen from above the principal surface thereof.
Figure 2B:
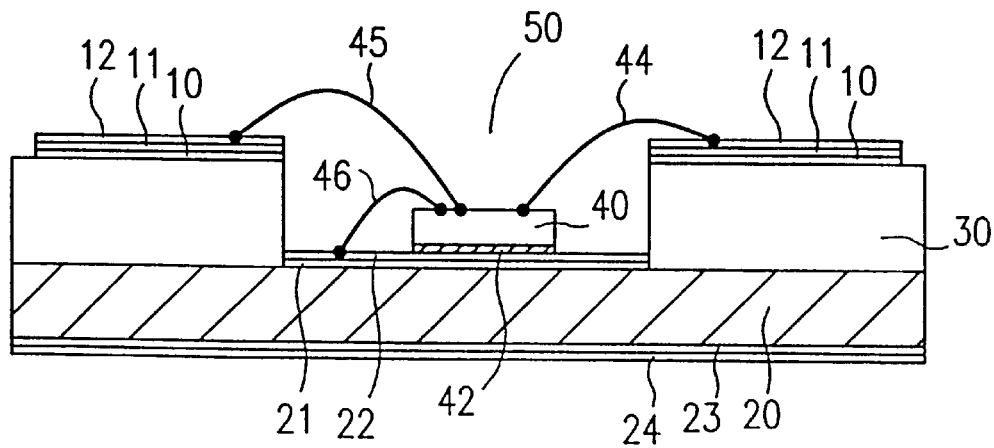
FIG. 2B is an enlarged cross-sectional view of the radio frequency module of the present invention.

FIG. 2A is an enlarged plan view of the radio frequency module of the present invention as seen from above the principal surface thereof. FIG. 2B is an enlarged cross-sectional view of the radio frequency module of the present invention. The radio frequency module shown in FIGS. 2A and 2B is different from the radio frequency module shown in FIGS. 1A and 1B in that the former radio frequency module includes a pair of stacked metal films 11 and 12 on the upper surface of the metal film 10, a pair of stacked metal films 21 and 22 on the exposed upper surface of the metal film 20 and a pair of stacked metal films 23 and 24 on the lower surface of the metal film 20.

The metal films 11, 21 and 23 are nickel or titanium, and the metal films 12, 22 and 24 are gold. By forming these stacked metal films on the metal films 10 and 20, the bonding using the drain wires 44, the gate wire 45 and the source wires 46 can be performed more easily.

FIG. 3A is an enlarged plan view of the radio frequency module of the present invention as seen from above the principal surface thereof. FIG. 3B is an enlarged cross-sectional view of the radio frequency module of the present invention. The radio frequency module shown in FIGS. 3A and 3B is different from the radio frequency module shown in FIGS. 1A and 1B in that the semiconductor chip 40 of the former radio frequency module is die bonded to a metal block 41 by means of soldering, and the metal block 41 is die bonded to the metal film 20 by means of soldering. In the same way as in the radio frequency module shown in FIGS. 1A and 1B, the semiconductor chip 40 is preferably coupled to the metal film 20 thermally at a heat resistance of about 3° C./W or less, and electrically at an electrical resistance of about 1 Ω or less.

In FIGS. 3A and 3B, a single semiconductor chip 40 is mounted on the metal block 41. Alternatively, a plurality of semiconductor chips 40 may be mounted thereon. In such a case, first, a plurality of semiconductor chips 40 are mounted on the metal block 41. Thereafter, the metal block 41 is mounted on the metal film 20, thereby improving the mounting efficiency.

FIGS. 4A through 4D are views showing an exemplary set of steps of a method for fabricating the printed circuit board 1 shown in FIGS. 1A and 1B.

Figure 4A:

First, in a step shown in FIGS. 4A, a metal film 10 and an insulating substrate 30 are attached to each other via an adhesive.

Figure 4B:
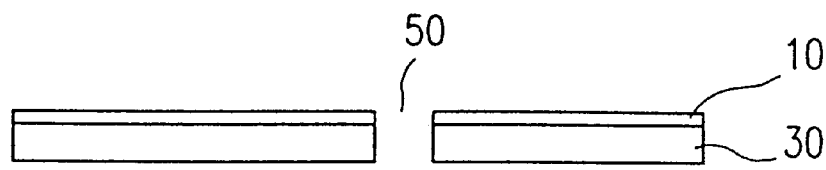

Next, in a step shown in FIG. 4B, an opening 50 is formed by punching the metal film 10 and the insulating substrate 30 which have been attached to each other.

Figure 4C:
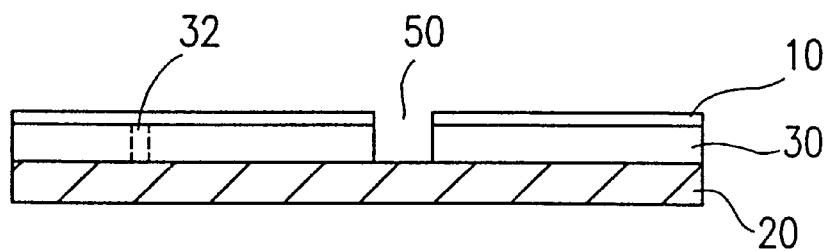

Subsequently, in a step shown in FIG. 4C, a metal film 20 is attached via an adhesive to the insulating substrate 30 through which the opening 50 has been formed, and a via hole 32 (to be described below) is formed for electrically coupling the metal film 10 to the metal film 20.

Figure 4D:
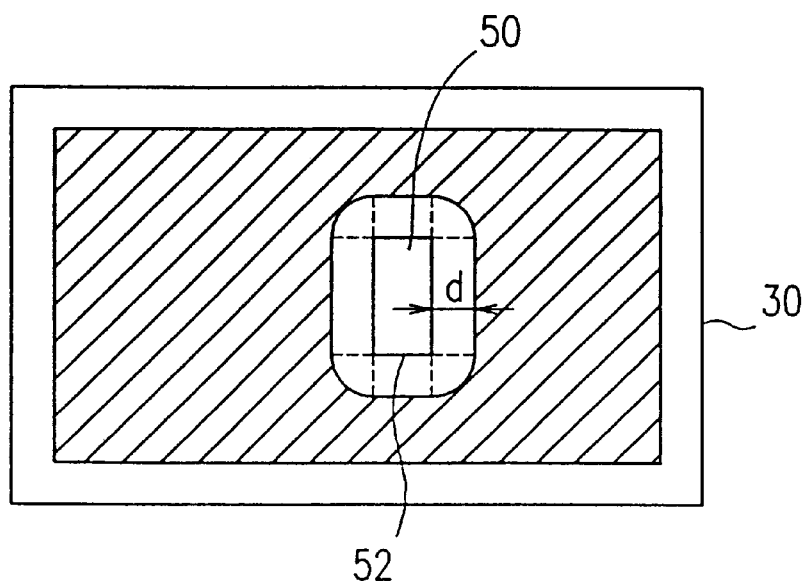

FIG. 4D is a plan view of the lower surface of the insulating substrate 30 showing the range within which the adhesive is applied thereto as seen from the metal film 20. The adhesive to be applied between the insulating substrate 30 and the metal film 20 shown in FIG. 4C for attaching them to each other is preferably applied at the hatched portion shown in FIG. 4D. In other words, it is preferable to apply the adhesive selectively in accordance with the distance d from the edge portion 52 of the opening 50. More specifically, it is preferable not to apply the adhesive to the range within which the distance d from the edge portion 52 is smaller than a predetermined value. The distance d is preferably in the range from about 2 mm to about 3 mm, both inclusive.

FIGS. 5A through 5C are cross-sectional views showing another exemplary set of steps of a method for fabricating the printed circuit board 1 shown in FIGS. 1A and 1B.

First, in a step shown in FIGS. 5A, a metal film 10 and an insulating substrate 30 are attached to each other with an adhesive.

Next, in a step shown in FIGS. 5B, a metal film 20 and the insulating substrate 30 are attached to each other with an adhesive.

Subsequently, in a step shown in FIG. 5C, a portion of the attached metal film 10 and insulating substrate 30 is cut out to such a depth as to expose the upper surface of the metal film 20, thereby forming an opening 50. Then, a via hole 32 for electrically coupling these metal films 10 and 20 is formed.

FIG. 6A is a plan view of the radio frequency module of the present invention as seen from above the principal surface thereof. FIG. 6B is a plan view of the radio frequency module of the present invention as seen from above the back surface thereof. FIG. 6C is a cross-sectional view taken along a line VIC—VIC shown in FIG. 6A. FIG. 6D is a cross-sectional view taken along line VID—VID shown in FIG. 6A.

As shown in FIG. 6A, a metal film 10 patterned by etching for forming a radio frequency circuit is provided on the principal surface of the printed circuit board 1. The thickness of the metal film 10 is about 40 μm, for example.

Various chip components 48 such as resistors and capacitors are mounted onto the metal film 10 by means of soldering.

Semiconductor chips 40 are die bonded by means of soldering onto the surface of metal film 20 which has been exposed inside the openings 50. The terminals of the semiconductor chips 40 are electrically connected to the metal film 10 or the pattern on the principal surface by means of wire bonding. The semiconductor chips 40 are, for example, an anterior-stage FET and a posterior-stage FET forming a two-stage amplifier circuit. However, the circuit configuration, the type of the elements and the number of the elements are not limited to those exemplified in FIG. 6A. Nevertheless, it should be noted that the present invention is particularly effective when the semiconductor chips 40 generate heat.

A part of the nodes of the radio frequency circuit, i.e., a part of the pattern of the metal film 10, is electrically connected to the metal film 20 through the via holes 34 filled with metal. As a result, a ground potential is applied to the nodes.

A metal film 20 on which a ground pattern is formed is provided so as to occupy a large area on the back surface of the printed circuit board 1. By etching and thereby electrically isolating a pat of the metal film 20 from the ground pattern, patterns Min, M1 and Mout used for connecting the radio frequency module to external circuits are formed. The patterns Min, M1 and Mout for connection with external circuits (hereinafter, such patterns will be referred to as "external connection patterns") are used for connecting the radio frequency module to the mother circuit board of a mobile communication unit, for example. The via holes 32 are used for connecting the external connection patterns Min, M1 and Mout to the pattern of the metal film 10 on the principal surface.

In FIG. 6B, the external connection pattern Min receives a radio frequency signal and the external connection pattern Mout outputs a radio frequency signal amplified by the radio frequency module. For example, when the semiconductor chips 40 are FETs, the external connection patterns M1 receive a direct current bias voltage to be supplied to the gates and the drains thereof and then supply the voltage to the semiconductor chips 40. The types, the number and the positions of the external connection patterns Min, M1 and Mout on the back surface of the printed circuit board 1 are not limited to those illustrated in FIG. 6B but may be modified in accordance with the type of an external circuit to which the radio frequency module is connected. According to the present invention, by providing the external connection patterns Min, M1 and Mout on the back-surface metal film 20, an effect can be attained in that it is no longer necessary to separately provide lead terminals in addition, since the metal film 20 has a sufficiently large thickness, another effect can also be attained in that a stable electrical connection with an external circuit can be maintained. Since the lead terminals are no longer necessary, the areas which has conventionally been reserved for mounting the lead terminals in prior art radio frequency modules can be omitted and a step for mounting the lead terminals can be omitted during the fabrication thereof.

In this radio frequency module of the present invention, a radiator plate and lead terminals which have been indispensable for conventional radio frequency modules are no longer necessary. As a result, the number of required components can be considerably reduced and the space reserved on the printed circuit board for mounting the radiator plate and the lead terminals can be eliminated. Consequently, the radio frequency module can be downsized and the number of fabrication process steps thereof can be reduced. Furthermore, according to the present invention, since a semiconductor device in a bare chip state can be directly die bonded onto the bottom of the opening of the printed circuit board, both the area and the thickness of the radio frequency module can be reduced.

FIG. 7A is a plan view of the radio frequency module of the present invention as seen from above the principal surface thereof. FIG. 7B is a cross-sectional view taken along the line VIIB—VIIB shown in FIG. 7A. The radio frequency module of the present invention shown in FIGS. 7A and 7B is different from the radio frequency module shown in FIGS. 6A to 6D in that the semiconductor chips 40 of the former radio frequency module are not mounted onto the printed circuit board 1 in a bare chip state, but after each of the semiconductor chips 40 has been sealed inside a package.

A semiconductor device 400 includes a semiconductor chip 40 therein. The semiconductor chip 40 is directly die bonded onto a package metal base 402. A ceramic frame 404 is formed on the package metal base 402. Electrodes 406 are formed on the ceramic frame 404 and package lead terminals 408 are provided so as to be electrically connected to the electrodes 406. Though not shown in FIG. 7B, the terminals of the semiconductor chip 40 are electrically connected to the electrodes 406 by means of wire bonding. The semiconductor device 400 is sealed with a resin such that the internal circuit components can be protected.

In this way, the radio frequency module of the present invention is applicable not only to a semiconductor device in a bare chip state but also to a semiconductor device sealed inside a package. In the latter case, the same effects as those described above can also be attained.

EXAMPLE 2

In the second example of the radio frequency module of the present invention, a semiconductor device is mounted on a principal-surface metal film. In this example, when heat generating semiconductor devices are mounted on the principal-surface metal film formed on a printed circuit board, the principal-surface metal film is thermally and electrically coupled to a back-surface metal film through via holes. In the radio frequency module according to the present invention, since the thickness of the back-surface metal film is larger than that of the principal-surface metal film, radiation can be efficiently performed without providing a radiator plate. Thus, in this second example, the semiconductor devices can be thermally and electrically coupled to the back-surface metal film without providing the openings of the first example through the printed circuit board. As a result, in addition to the effects attained by the first example, an additional effect can be attained in that the step of forming the openings can be eliminated.

FIG. 8A is a plan view of the radio frequency module of the present invention (on which a semiconductor device has not been mounted yet) as seen from above the principal surface thereof. FIG. 6B is a plan view of the radio frequency module of the present invention as seen from above the back surface thereof. FIG. 8C is a plan view of the radio frequency module of the present invention (on which the semiconductor device has already been mounted) as seen from above the principal surface thereof. FIG. 8D is a cross-sectional view taken along a line VIIID—VIIID shown in FIG. 8C.

The printed circuit board 1 of the second example is not provided with openings 50 of the first example but with via holes 38. The metal films 10 and 20 and the insulating substrate 30 of the printed circuit board 1 of the second example have the same thicknesses and are made of the same materials as those of the printed circuit board 1 of the first example.

FIG. 9A is a plan view of the semiconductor device 400 to be mounted onto the printed circuit board 1 shown in FIGS. 8A and 8B as seen from a side opposite to a side including a ground electrode on the back surface of a package. FIG. 9B is a plan view of the semiconductor device 400 to be mounted onto the printed circuit board 1 shown in FIGS. 8A and 8B as seen from the side including the ground electrode on the back surface of the package. In the second example, the semiconductor device 400 preferably has a ground electrode 412 on the back surface of the package, as shown in FIG. 9B. The semiconductor device 400 further includes connection pins 414 to be connected to the metal film 10 or the pattern on the principal surface of the printed circuit board 1.

The via holes 38 shown in FIGS. 8A, 8B and 8D thermally and electrically couple the principal-surface metal film 10 to the back-surface metal film 20. The number of the via holes 38 is not limited to three but may be increased or decreased in order to obtain a desired heat resistance and a desired electrical resistance.

In the semiconductor device 400, a semiconductor chip 40 has been molded and then sealed with a resin inside the package thereof. The semiconductor chip 40 is connected thermally and electrically to the ground electrode 412 inside the package, thereby dissipating the heat generating from the semiconductor chip 40 to the outside via the ground electrode 412. The ground electrode 412 has been exposed on the back surface of the package such that the ground electrode 412 can be soldered with the principal-surface metal film 10 when the semiconductor device 400 is mounted onto the printed circuit board 1.

The semiconductor device 400 is disposed on the printed circuit board 1 such that the ground electrode 412 can be soldered with the metal film 10 in the vicinity of the via holes 38. As a result, the heat generated from the semiconductor chip 40 inside the semiconductor device 400 is dissipated into the metal film 20 via the ground electrode 412, the metal film 10 and the via holes 38. The semiconductor device 400 is preferably disposed such that the via holes 38 are included within a region of the metal film 10 which faces the ground electrode 412. More preferably, the semiconductor device 400 is disposed such that the via holes 38 are located just under the ground electrode 412.

The semiconductor chip 40 is thermally and electrically coupled to the metal film 20 via the ground electrode 412, a solder layer (not shown), the metal film 10 and the via holes 38. As a result, a ground potential, for example, can be applied to the predetermined terminals of the semiconductor chip 40 and the heat generated from the semiconductor chip 40 can be dissipated into the metal film 20. Preferably, the semiconductor chip 40 is coupled to the metal film 20 thermally at a heat resistance of about 3° C./W or less, and electrically at an electrical resistance of about 1 Ω or less.

In the same way as in the first example, the thickness of the metal film 20 is larger than that of the metal film 10. Since the frequency selected for operating the radio frequency module is several hundred MHz or higher, the thickness of the metal film 10 is preferably about 10 μm or more in order to prevent the inductance from being increased owing to the skin effects and preferably less than about 100 μm in order to form a fine pattern suitable for a radio frequency circuit thereon. More preferably, the thickness of the metal film 10 is in an approximate range from about 30 μm to about 50 μm, both inclusive.

In order to attain sufficient radiation effects, the thickness of the metal film 20 is preferably about 100 μm or more. On the other hand, in order to form a pattern for providing external connection terminals on the metal film 20, the thickness of the metal film 20 is preferably 1000 μm or less. More preferably, the thickness of the metal film 20 is in an approximate range from about 200 μm to about 300 μm, both inclusive.

Almost the entire surface of the metal film 20 on the back surface of the printed circuit board 1 is used as a ground surface, and contributes to the heat radiation from the semiconductor chip 40 and the stabilization of the radio frequency characteristics. On the other hand, a part of the back-surface metal film 20 is electrically isolated from the other part, thereby functioning as external connection patterns 36. The external connection patterns 36 are electrically connected to the metal film 10 or the pattern on the principal surface through the via holes 32. The external connection patterns 36 have the same functions as those of the external connection patterns Min, M1 and Mout of the first example. Thus, in the same way as in the first example, the external connection patterns 36 can be provided by patterning the metal film 20 in the second example. As a result, there is no need of providing the lead terminals.

FIGS. 8C and 8D show a state where the semiconductor device 400 has been mounted on the printed circuit board 1. Though the semiconductor device 100 shown in FIGS. 8C and 8D includes an integrated circuit (IC) chip therein, a separate semiconductor device such as an FET may also be provided instead.

EXAMPLE 3

FIGS. 10A through 10F are views showing the process steps for fabricating the radio frequency module of the present invention.

Figure 10A:
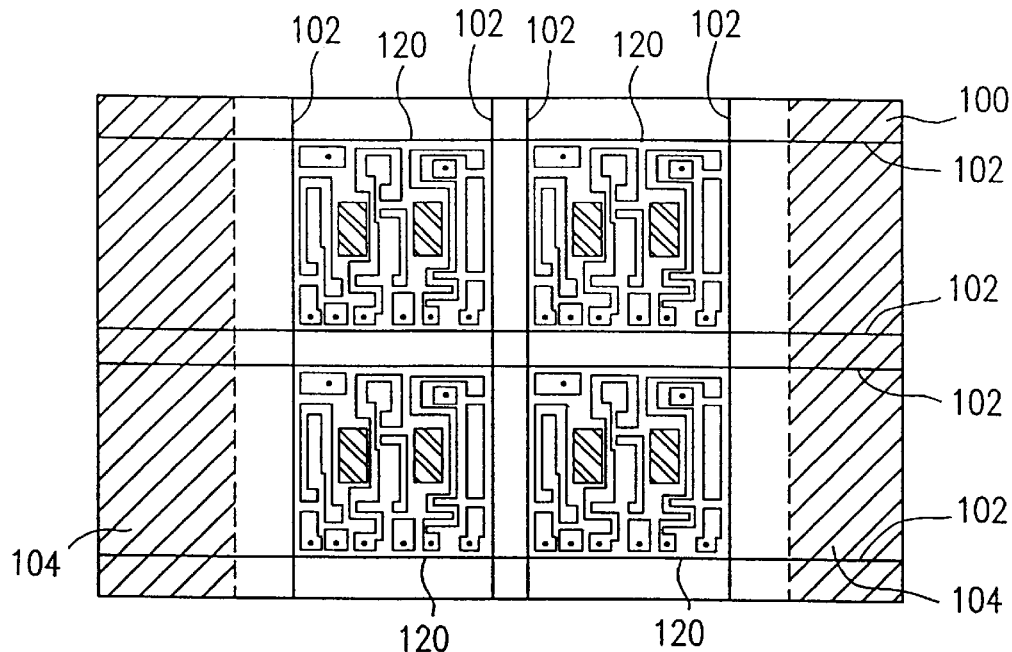

In a step shown in FIG. 10A, an undivided circuit board 100 for mounting a plurality of radio frequency modules thereon is fabricated. A plurality of circuit board divisions 120 are provided on the undivided circuit board 100. Various components of a single radio frequency module are mounted in each circuit board division 120. Each circuit board division 120 corresponds to the printed circuit board 1 shown in FIGS. 6A to 6D, for example. Division grooves 102 are formed on the surface of the undivided circuit board 100 in order to facilitate the division of the undivided circuit board 100 into the circuit board divisions 120 after the works performed on the radio frequency modules on the undivided circuit board 100 have been completed. The depth of the division grooves 102 is preferably about one-half of the thickness of the undivided circuit board 100. In such a case, the division can be performed manually instead of using a machine.

In FIG. 10A, four circuit board divisions 120 are provided on the undivided circuit board 100. However, the number of the circuit board divisions 120 is not limited thereto. When a larger number of circuit board divisions 120 can be formed on a single undivided circuit board 100, the respective steps including mounting various components, test and adjustment of the radio frequency modules and mounting of shield members can be performed more efficiently.

On the back surface of the undivided circuit board 100, ground electrodes 104 having sufficiently large areas are laid out around the plurality of circuit board divisions 120, thereby stabilizing the ground potential. As a result, when the characteristics of the radio frequency modules are tested (to be described later), the test can be performed more stably.

Figure 10B:
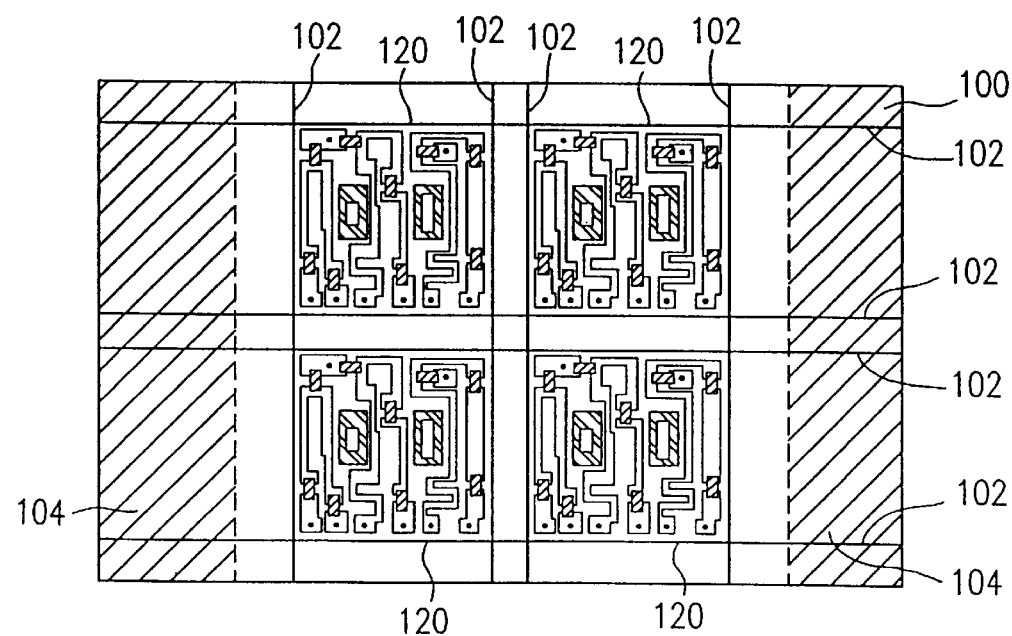

In a step shown in FIG. 10B, the components of the radio frequency modules are mounted into the respective circuit board divisions 120. For example, the semiconductor chip 40 and the chip components 48 shown in FIG. 6A are mounted in each circuit board division 120. In this step, the wire bonding for electrically connecting the semiconductor chip 40 shown in FIG. 6A to the metal film 10 is also performed. That is to say, after the mounting step shown in FIG. 10B and the connection of the radio frequency modules to external circuits (including testing equipment) are completed, the respective radio frequency modules are in an operable state.

According to the present invention, since the back-surface metal film 20 shown in FIG. 6B radiates the heat generated from the semiconductor chip 40, the respective radio frequency modules can be operated on the undivided circuit board 100. Thus, the below-described works such as test and adjustment of the respective radio frequency modules and mounting of shield members can be performed before the undivided circuit board 100 is divided into the circuit board divisions 120.

Figure 10C:
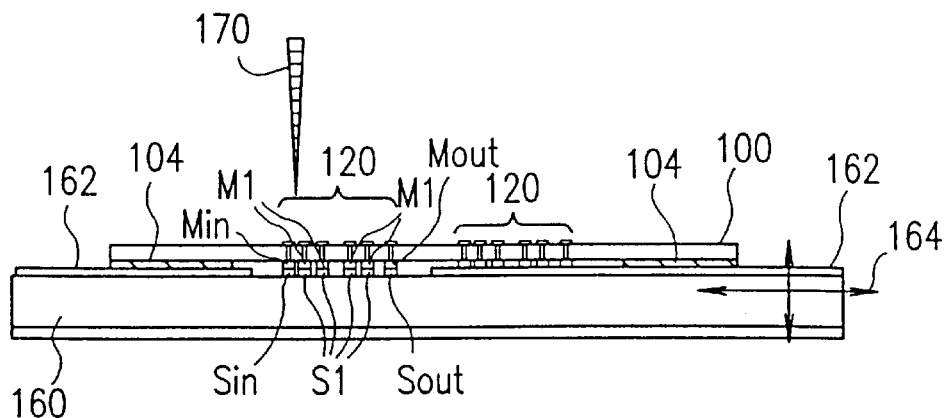

In a step shown in FIG. 10C, the undivided circuit board 100 is fixed on a tester substrate 160, thereby testing and/or adjusting the radio frequency modules. Almost the entire region of the upper surface of the tester substrate 160 is occupied by a ground electrode 162, thereby stabilizing the ground potential and connecting the terminals of the circuit board divisions 120 corresponding to currently non-tested radio frequency modules to the ground. During the test, the radio frequency power input/output characteristics, the gain, the power efficiency and the like of the radio frequency module can be measured. A radio frequency input power is supplied through a pattern Sin, a power amplified by the radio frequency module is output through a pattern Sout and a direct current bias is applied through patterns S1 to the radio frequency module. The respective patterns Sin, S1 and Sout are contacted with the associated terminals of the radio frequency module.

FIG. 11 is a plan view of the tester substrate 160 as seen from above the surface on which the undivided circuit board 100 is placed. The tester substrate 160 has patterns Sin, S1 and Sout (e.g., associated with the external connection patterns Min, M1 and Mout shown in FIG. 6B, respectively) such that the radio frequency modules can be individually tested one by one. The pattern Sin receives a radio frequency signal output from the radio frequency module and the pattern Sout outputs a radio frequency signal to the radio frequency module. The patterns S1 supply a direct current bias to the radio frequency module. By applying a pressure thereto, the patterns Sin, S1 and Sout can be respectively connected to the external connection patterns Min, M1 and Mout of the radio frequency module at an electrical resistance sufficiently low for testing.

In the case where the characteristics of an individual radio frequency module shown in FIG. 10C are represented as values lower than the predetermined values, a laser beam 170 is used, thereby varying the values of chip components 48 such as resistors and capacitors which are mounted on the radio frequency module and can be trimmed by laser. Then, the characteristics of the radio frequency module can be tested again after the characteristics of the radio frequency module have been adjusted.

In the case of testing a plurality of radio frequency modules, the location of the laser beam 170 may be fixed and the tester substrate 160 may be moved (as indicated by the arrows 164), for example. As a result, a plurality of radio frequency modules on the undivided circuit board 100 can be tested and adjusted at a higher speed and the radio frequency modules can be fabricated more efficiently. A test and adjustment loop may be repeatedly performed a desired number of times by using machinery.

Figure 10D:
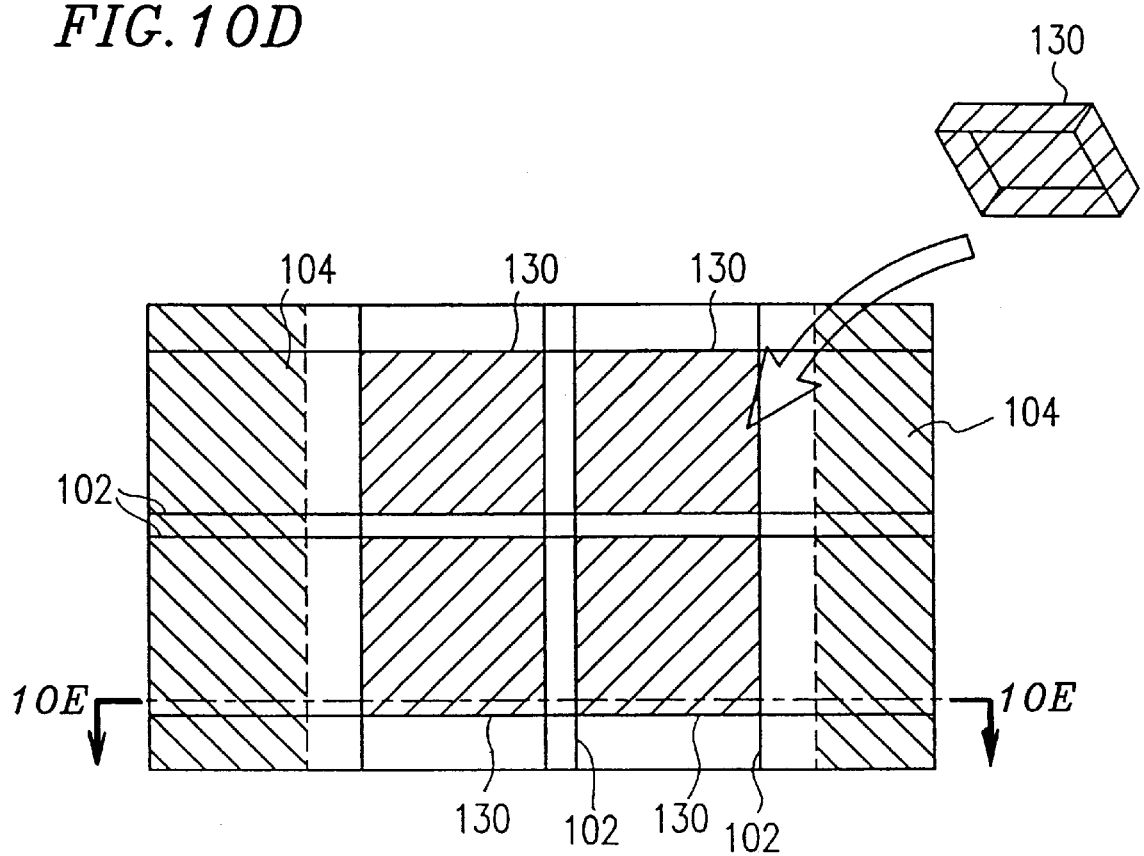
Figure 10E:
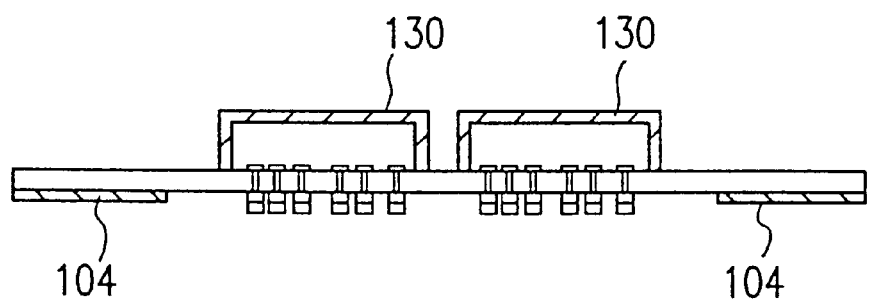

In a step shown in FIG. 10D, the shield members 130 are mounted so as to cover the radio frequency modules in the respective circuit board divisions 120 therewith. The mounting of the shield members 130 shown in FIG. 10D is performed after the test and the adjustment shown in FIG. 10C have been completed. Each of the shield members 130 is made of a metallic thin plate, for example, and shields a completed radio frequency module from an electromagnetic interruption from an external circuit (e.g., a mobile communication unit) when the radio frequency module operates. For example, the shield member 130 is soldered with the metal film 10 shown in FIG. 6A and is electrically connected to the ground surface on the back surface of the printed circuit board through the via holes. FIG. 10E is a cross-sectional view taken along the line XD—XD shown in FIG. 10D.

It is noted that, when the laser trimming is not necessary, the test may be performed after the shield members 130 have been mounted as shown in FIG. 10E. When the radio frequency module incorporated into an actually used machine is actually operated, the radio frequency module is shielded by the shield member 130. Thus, if the test is performed after the shield member 130 has been mounted, then the radio frequency module can be tested more precisely, because the test is performed under an environment closer to an actual operating environment.

Figure 10F:
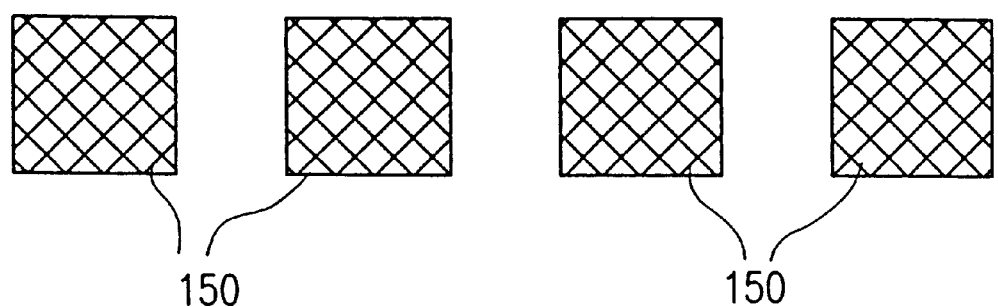

Finally, in a step shown in FIG. 10F, the undivided circuit board 100 is divided into the respective circuit board division 120, thereby completing the radio frequency modules.

As has been described with reference to FIGS. 10A to 10F, in the method for fabricating the radio frequency module according to the present invention, a plurality of radio frequency modules are first mounted in the circuit board divisions 120 on the undivided circuit board 100. Next, in such a state where the radio frequency modules have been mounted on the undivided circuit board 100, test and adjustment of the respective modules and mounting of the shield members are simultaneously performed on the basis of the undivided circuit board 100. As a result, the fabrication process can be simplified and automated. The test and the adjustment of the radio frequency modules are enabled not on the basis of a single circuit board division 120 but on the basis of a single undivided circuit board 100. This is partly because the radio frequency module of the present invention includes a metal film having a radiation effect on the back surface thereof and because the radio frequency module of the present invention includes external connection patterns (such as Min, M1 and Mout shown in FIG. 6B) on the back surface of the printed circuit board.

In the conventional technologies, in order to operate a radio frequency module including a heat generating semiconductor device, a radiator plate is required to be mounted even during a test. In order to mount the radiator plate, the undivided circuit board 100 must be once divided. Thus, there is no means other than performing test, adjustment and shield member mounting on an individual radio frequency module. In other words, it has been extremely difficult to perform automated works on an individual radio frequency module by using machinery. Consequently, in the conventional technologies, the steps shown in FIGS. 10C and 10D have been performed manually. In addition, in the conventional technologies, it has been necessary to mount the lead terminals onto a radio frequency module for testing the module.

In contrast, according to the present invention, the test, adjustment and mounting steps can be performed while the radio frequency modules are still mounted on the undivided circuit board 100. Thus, an effect can be attained in that the fabrication process of the radio frequency modules can be automated consistently. That is to say, after the undivided circuit board 100 itself has been completed, all the process steps including the mounting of the components, the test of the circuits, the parameter adjustment of the components, the provision of the shield members and the division into the respective modules can be performed preferably by machinery without dividing the undivided circuit board 100 until the final step. In addition, since the radiator plate and the lead terminals can be eliminated, the present invention considerably contributes to the downsizing of a radio frequency module.

FIGS. 12A and 12B are views showing another exemplary substrate used for testing the radio frequency module. A tester substrate 180 corresponds to the tester substrate 160. A ground electrode 182 and patterns Tin, T1 and Tout correspond to the ground electrode 162 and the patterns Sin, S1 and Sout, respectively.

In this specification, a semiconductor device, more particularly an FET used for an amplifier, has been exemplified as a heat generating component. However, the heat generating component is not limited thereto. Alternatively, any other semiconductor device or passive component may be used as the heat generating component.

It is noted that the method for fabricating the radio frequency module according to the present invention is applicable to the radio frequency module having the embodiments described in the first and the second examples. That is to say, so long as the respective fabrication process steps of the method described in the third example are performed, the method of the present invention is applicable either to a radio frequency module of such a type as having openings or to a radio frequency module of such a type as having via holes.

As is apparent from the foregoing description, in the radio frequency module of the present invention, a heat generating semiconductor device is thermally and electrically coupled to a back-surface metal film having a thickness larger than that of a principal-surface metal film. As a result, the radio frequency module can be operated without mounting a radiator plate thereon and the number of required components and the size of the module can be reduced. In addition, while the radio frequency module is fabricated, the test, adjustment or mounting can be performed simultaneously on a plurality of radio frequency modules mounted on a single undivided circuit board.

Moreover, in the radio frequency module of the present invention, external connection patterns are formed on the back-surface metal film by etching and patterning the back-surface metal film so that the lead terminals can be omitted.

Furthermore, in the radio frequency module of the present invention, a semiconductor device is mounted inside an opening provided through the printed circuit board, thereby reducing the thickness of the module.

Furthermore, in the radio frequency module of the present invention, the semiconductor device can be coupled thermally and electrically to the back-surface metal film by providing the via holes through the printed circuit board. As a result, the radiator plate can be omitted even when the openings are not formed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A radio frequency module comprising
   an insulating substrate having a first metal film on a first principal surface thereof and a second metal film on a second principal surface thereof opposed to the first principal surface,
   a semiconductor device, and
   an opening extending through the first metal film and the insulating substrate,
   wherein the semiconductor device is located inside the opening,
   the semiconductor device is mounted directly or via a conductor to the second metal film,
   the semiconductor device is thermally and electrically coupled to the second metal film, so that the second metal film absorbs the heat generated from the semiconductor device,
   and wherein a thickness of the second metal film is larger than that of the first metal film.

2. A radio frequency module according to claim 1, further comprising a via hole for thermally and electrically coupling the first metal film to the second metal film,
   wherein the semiconductor device is thermally and electrically coupled to the second metal film through the via hole.

3. A radio frequency module according to claim 1, wherein the thickness of the first metal film is from about 10 $\mu$m to about 100 $\mu$m, both inclusive, and the thickness of the second metal film is from about 100 $\mu$m to about 1000 $\mu$m, both inclusive.

4. A radio frequency module according to claim 3, wherein the thickness of the first metal film is from about 30 $\mu$m to about 50 $\mu$m, both inclusive, and the thickness of the second metal film is from about 200 $\mu$m to about 300 $\mu$m, both inclusive.

5. A radio frequency module according to claim 1, wherein the first metal film or the second metal film includes a multi-layer structure of copper/nickel/gold layers or a multi-layer structure of copper/titanium/gold layers, and wherein the copper/nickel/gold layers and the copper/titanium/gold layers are stacked such that distances from a center in a thickness direction of the second metal film to the copper/nickel/gold layers and the copper/titanium/gold layers increase in this order.

6. A radio frequency module according to claim 1, wherein the semiconductor device is sealed inside a package.

7. A radio frequency module according to claim 1, wherein the semiconductor device is a bare chip.

8. A radio frequency module according to claim 1, wherein the semiconductor device is mounted on a metal block.

9. A radio frequency module according to claim 1, wherein the semiconductor device is coupled to the second metal film thermally at a heat resistance of about 3° C./W or less and electrically at an electrical resistance of about 1 Ω or less.

10. A radio frequency module according to claim 1, wherein the second metal film is patterned.

11. A radio frequency module according to claim 10, wherein at least a part of the patterned second metal film is electrically coupled to the first metal film through a via hole.

12. A radio frequency module according to claim 2, wherein the thickness of the first metal film is from about 10 $\mu$m to about 100 $\mu$m, both inclusive, and the thickness of the second metal film is from about 100 $\mu$m to about 1000 $\mu$m, both inclusive.

13. A radio frequency module according to claim 12, wherein the thickness of the first metal film is from about 30 $\mu$m to about 50 $\mu$m, both inclusive, and the thickness of the second metal film is from about 200 $\mu$m to about 300 $\mu$m, both inclusive.

14. A radio frequency module according to claim 2, wherein the first metal film or the second metal film includes a multi-layer structure of copper/nickel/gold layers or a multi-layer structure of copper/titanium/gold layers.

and wherein the copper/nickel/gold layers and the copper/titanium/gold layers are stacked such that distances from a center in a thickness direction of the second metal film to the copper/nickel/gold layers and the copper/titanium/gold layers increase in this order.

15. A radio frequency module according to claim 2, wherein the semiconductor device is sealed inside a package.

16. A radio frequency module according to claim 2, wherein the semiconductor device is a bare chip.

17. A radio frequency module according to claim 2, wherein the semiconductor device is mounted on a metal block.

18. A radio frequency module according to claim 2, wherein the semiconductor device is coupled to the second metal film thermally at a heat resistance of about 3° C./W or less and electrically at an electrical resistance of about 1 Ω or less.

19. A radio frequency module according to claim 2, wherein the second metal film is patterned.

20. A radio frequency module according to claim 19, wherein at least a part of the patterned second metal film is electrically coupled to the first metal film through a via hole.

* * * * *